United States Patent [19]

Pope et al.

[11] Patent Number: 5,007,163
[45] Date of Patent: Apr. 16, 1991

[54] NON-DESTRUCTURE METHOD OF PERFORMING ELECTRICAL BURN-IN TESTING OF SEMICONDUCTOR CHIPS

[75] Inventors: Keith R. Pope; Gustav Schrottke, both of Austin, Tex.

[73] Assignee: International Business Machines Corporation, Armonk, N.Y.

[21] Appl. No.: 510,497

[22] Filed: Apr. 18, 1990

[51] Int. Cl.$^5$ .............................................. H05K 3/34
[52] U.S. Cl. ........................................ 29/840; 29/857; 228/123; 228/180.2; 361/406; 437/180
[58] Field of Search ................. 437/180, 8; 228/180.2, 228/123; 29/857, 840; 439/876; 361/404, 405, 406

[56] References Cited

U.S. PATENT DOCUMENTS

| 3,141,226 | 7/1964 | Bender et al. | 228/123 X |
| 3,436,818 | 4/1969 | Merrin et al. | 361/406 X |
| 3,646,670 | 3/1972 | Maeda et al. | 228/780.2 X |
| 3,702,500 | 11/1972 | Gorinas et al. | 29/857 |
| 3,716,907 | 2/1973 | Anderson | 228/180.2 X |
| 3,811,186 | 5/1974 | Larnerd et al. | 437/180 X |
| 3,871,014 | 3/1975 | King et al. | 437/180 X |
| 4,673,772 | 6/1987 | Satoh et al. | 228/180.2 X |
| 4,887,760 | 12/1989 | Yoshino et al. | 228/180.2 X |

FOREIGN PATENT DOCUMENTS 1122856 5/1982 Canada ............................... 228/123

OTHER PUBLICATIONS

W. Ward, "Low-Temperature Soldered Component Removal", IBM TDB, vol. 19, No. 7, 12/76, p. 2476.
P. Angelone, "Method for Removing Flip Chips", IBM TDB, vol. 19, No. 7, 12/76, p. 2477.
A. Bry et al, "Reusable Chip Test Package", IBM TDB, vol. 22, No. 4, 9/79, p. 1476.
C. Chiou et al, "Localized Heating of Chip Bonding Pad", IBM TDB, vol. 9, No. 8, 1/67, pp. 1051-1052.
A. Formichelli et al., "Non-Destructive Torsional Chip Removal", IBM TDB, vol. 26, No. 9, 2/84, pp. 4780-4782.

Primary Examiner—Carl E. Hall
Assistant Examiner—Carl J. Arbes
Attorney, Agent, or Firm—Andrea P. Bryant

[57] ABSTRACT

A method of nondestructively testing electronic chips adapted for direct attachment to metallized pads on circuitized substrate is disclosed, wherein an electrically conductive liquid eutectic joint is formed at room temperature with low pressure between electrical terminals on the chip and pads on the substrate. The eutectic joint remains liquid at test temperature, enabling test completion. At the end thereof, chips and pads are separated and any eutectic material residue thereon removed. The eutectic is preferably gallium/indium.

6 Claims, 3 Drawing Sheets

NON-DESTRUCTURE METHOD OF PERFORMING ELECTRICAL BURN-IN TESTING OF SEMICONDUCTOR CHIPS

BACKGROUND OF THE INVENTION

1. Field of the Invention

This invention relates to electronic chip testing. More particularly, it relates to non-destructive chip burn-in prior to attachment to a circuitized substrate.

2. Prior Art

Conventionally, chips are tested at the wafer level with "good" chips being subsequently wired into a variety of packages. To weed out early life failures in chips so packaged, the chips are systematically subjected to electrical and environmental stress. Test parameters for such "burn-in" testing are higher than the intended power and temperature expected during normal use but are set at such levels in order to cause failure of weak parts. In practice this technique yields 90%-100% good chips for mature chip programs, and the 0%-10% drop out reduces field failures in actual machines.

Conventional burn-in approaches include several techniques, but in most cases packaged devices are subjected to the process. In one such practice, chips are permanently mounted, burned-in and tested as a final assembly. Parts that fall out during testing must be replaced using burned-in chips removed from other assemblies, which are subsequently scrapped. In another, packaged devices are inserted into connectors on a test board which are placed in a burn-in oven. Good devices are then mounted on a board to form the final assembly.

Attempts have been made to nondestructively test chips. One method uses a fixture with multiple probes to contact chip metallurgy and run tests. IBM Technical Disclosure Bulletin, Vol. 22, No. 4, 9/79, p. 1476 to Bry et al discloses a test fixture requiring no bonding, between chips under test and a substrate. Rather, mechanical forces are used to ensure contact between test probes and electrical terminals of the chip under test. IBM TDB, Vol. 9, No. 8, 1/67, p. 1051 to Chiou et al relates to localized heating of chip bonding pads. Silicon devices are bonded to gold pad on an insulating substrate with high heat. 370 deg. C. and pressure. To selectively remove and replace a silicon device, the pad is locally heated to a temperature in excess of the gold-silicon eutectic temperature. Chips must be subsequently removed by mechanically shearing or by some other technique which frequently damages the solder bumps on the chips. Removal techniques are disclosed in IBM Technical Disclosure Bulletin, Vol 25, No. 9, 2/84, p. 4780 to Formichelli et al. Vol 19, No. 7, 12/76, p. 2476 to Ward and Vol. 19, No. 7, 12/76, p. 2477 to Angelone.

Each of the above described methods when viewed from the perspective of solder bump integrity, ease of rework and manufacturability has several drawbacks. For instance, once a chip is broken off after burn-in and added to its final assembly, cracks at the junction of the chip pad and C4 bump due to stresses induced when the pad was broken could causes reliability problems when the chip is applied to a final assembly.

Direct chip attach (DCA) techniques eliminate costs associated with first level packaging. In addition, DCA chips may be more densely packaged, yielding a smaller assembly. In order to effectively use DCA assemblies, the devices to be mounted must be burned-in, preferably at the chip level.

Burn-in testing is particularly desirable in these multi-chip module applications. Overall yield in a multi-chip module is a function of individual chip yield (Y) and the number of chips (N). The yield for the multi-chip module is determined by multiplying the chip yield (Y) by itself N times. Detection of chip failures before the assembly process decreases ultimate waste and maximizes overall yield.

SUMMARY OF THE INVENTION

The present invention overcomes the aforementioned prior art problems by providing a chip burn-in technique which is non-destructive and in which interconnect is accomplished at room temperature and the pads remain conductive at burn-in temperature to allow burn-in testing.

The present invention contemplates attaching chips to a substrate using a liquid metal joint formed between the solder bumps on the chip to be tested and the contact pads on a circuitized substrate used as a test vehicle. A pair of metals is chosen which when brought into contact, form a eutectic mixture. In the preferred embodiment, one of the metals is deposited on the solder bumps on the chip. The second metal is deposited on the test card pads. Raising the temperature of the metals above the eutectic melting temperature permits chips to self center as the eutectic material forms at the junction of the two metals and remains in that state during testing. Ideally the eutectic is liquid at room temperature, whereas the individual component metals are solids at room temperature. The liquid state of the eutectic material is maintained until the test is completed. The chip is then removed from the test board and before solidification occurs, any residue of the eutectic material is removed from the chip.

The present invention includes the advantages of minimizing alignment problems and the tendency toward C4 cracking as other chip burn-in techniques.

BRIEF DESCRIPTION OF THE DRAWING

The above and other features and advantages of the present invention become clear from the following description, taken in conjunction with the accompanying drawing wherein the same reference numerals are used throughout to designate the same parts and wherein.

DESCRIPTION OF THE PREFERRED EMBODIMENT

Figure 1:
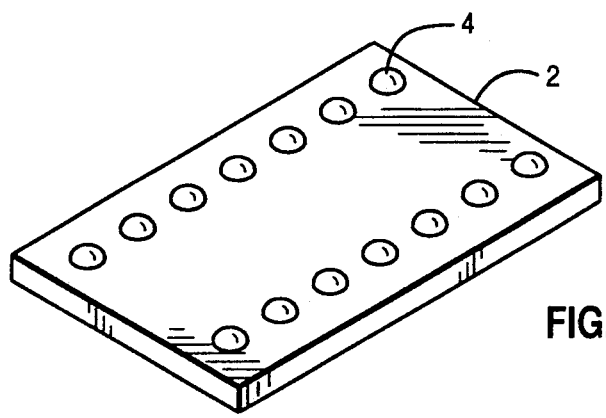
FIG. 1 is a schematic plan view of a chip with solder bumps.
Figure 2:
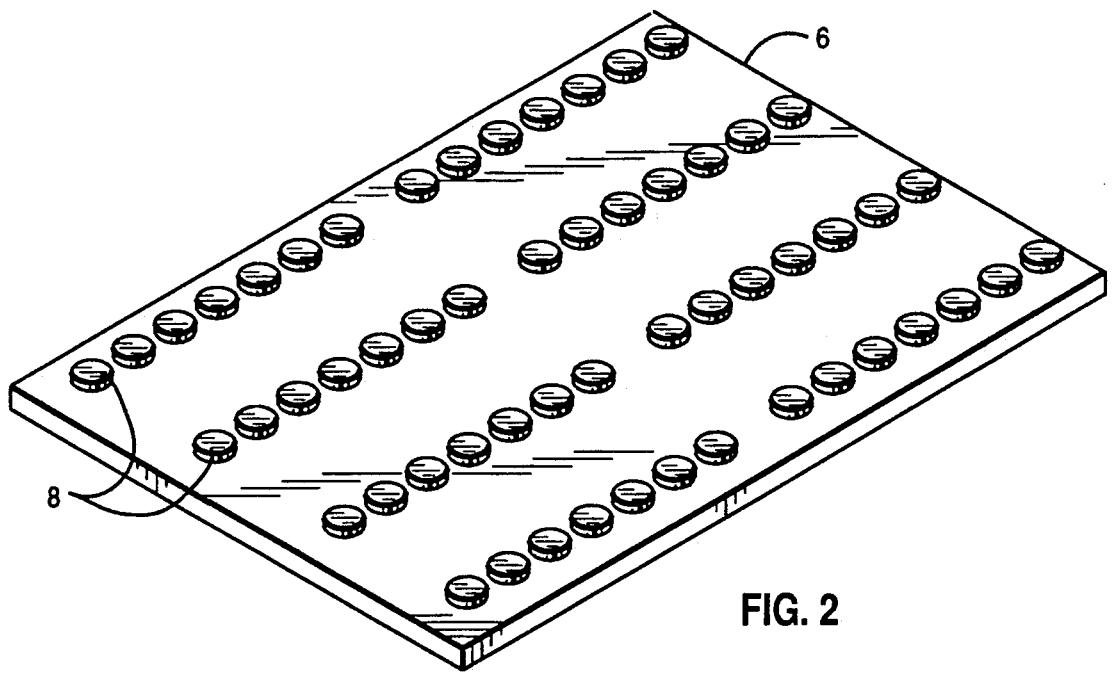
FIG. 2 is a schematic plan by diagram of a test substrate.

Referring now to FIGS. 1 and 2, a more detailed description of the present invention will begin.

FIG. 1 represents a single chip 2, such as a memory chip having a plurality of solder bumps 4 arranged thereon which solder bumps in our illustrative preferred embodiment are controlled collapse chip connection (C4).

FIG. 2 represents a test circuit having a plurality of electrical pads 8 arranged in a complimentary pattern to the C4 bumps 4 on chips 2.

Figure 3:
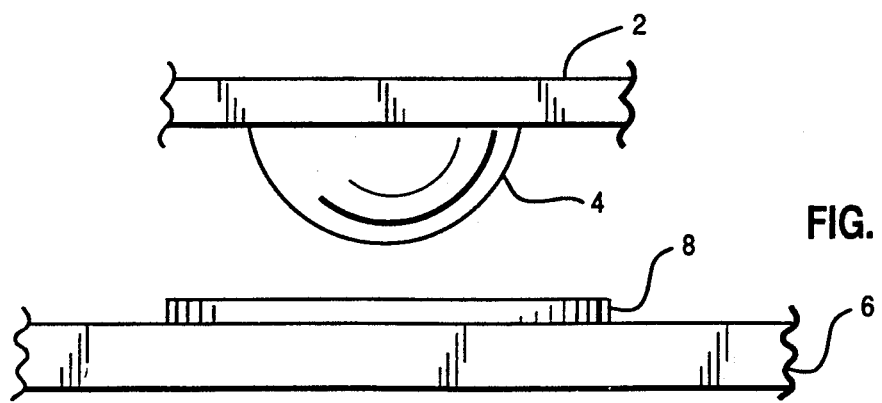
FIG. 3 is an exploded schematic view of a chip solder bump and a conductive pad on a circuitized substrate.

Refer now to FIG. 3. An electronic chip 2 is schematically illustrated. To perform burn-in testing, chip 2 must be attached to circuitized substrate 6, a portion only of which is shown. Electrical contact is to occur between the C4 bump 4, one shown, and conductive pad 8 on substrate 6.

Figure 4:
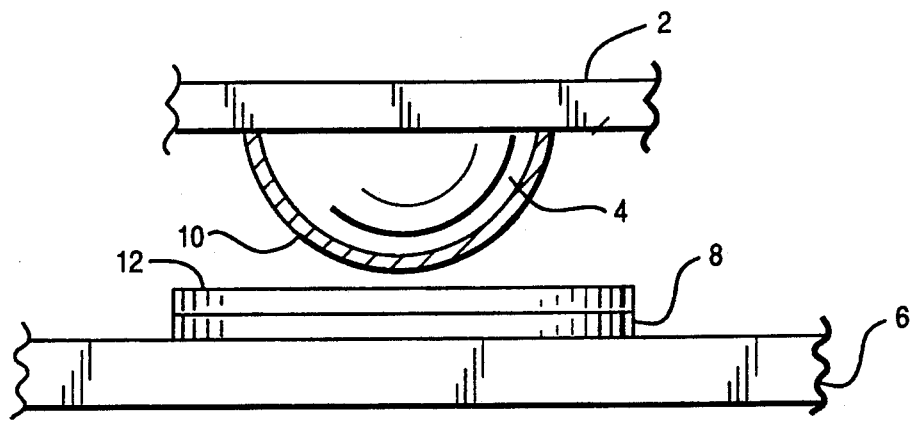
FIG. 4 is the same view as FIG. 1 after solder bump and pad metallization.

FIG. 4 illustrates the chip and substrate of FIG. 1 after metallization in accordance with the present invention. Metals 10 and 12 are deposited on C4 bump 6 and conductive pad 8, respectively. Any of several well known application techniques may be used to deposit metals 10 and 12 on C4 bump 4 and conductive pads 8, respectively. Those having skill in the art will recognize, for example, that vapor deposition or chemical vapor deposition through a mask are processes which may be readily performed to deposit metals 10 and 12.

Metals 10 and 12 are chosen from those which form an electrically conductive eutectic material at room temperature 25 deg. C. or slightly above this temperature. In this preferred illustrative embodiment, metal 10 is gallium and metal 12 is indium. When gallium and indium are brought into contact at room temperature with slight pressure, a liquid eutectic is formed at their interface. As a practical matter, it is only important that the melting point of the eutectic solder formed be lower than the temperature at which the device will be burned-in, generally at 125 deg. C. Ideal values for the eutectic melting point will range from 10 deg. C. to 30 deg. C.

We have found gallium-indium eutectic forms spontaneously at approximately 25 deg. C. with very little pressure and will remain in a liquid state.

In general, metal 10, gallium, is coated in a relatively thin layer preferably about one mil. Metal 12, indium, is deposited to a thickness of about one to three (1-3) mils. The small amount of gallium at the joint facilitates reuse of a test card several times before the melting point will be such that a permanent liquid metal is formed, i.e. before indium 12 on pad 8 is consumed.

Figure 5:
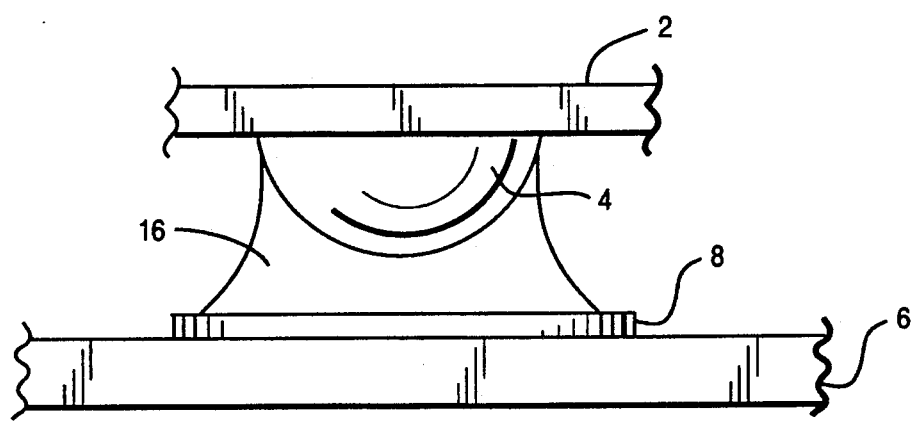
FIG. 5 shows the eutectic between a solder bump and pad.

Referring now to FIG. 5, the resulting material is represented at 16. Eutectic material 16 remains in the liquid state while burn-in testing of chip 2 takes place.

At the completion of the burn-in test, chip 2 is removed from substrate 6. The separation occurs at the eutectic material 16. Any eutectic material remaining on C4 bump 4 and/or metallized pad 8 may be removed such as by applying air pressure.

Figure 6:
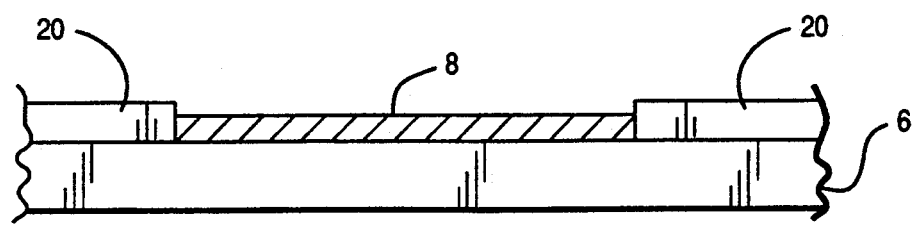
FIG. 6 is a test substrate including solder dams.

FIG. 6 represents substrate 6 and a single electrical pad 8 with the addition of solder dam 20 on either side of electrical contact pad 8. Those skilled in the art will understand each contact pad 8 such as shown in FIG. 2 may be surrounded by solder dams 20.

It is conventional to design circuit cards so that a protective coating of a polymeric material covers the card, except with windows through the productive coating where solder contact are to be made to metal pads. The walls of the polymeric coating at the windows are referred to here as solder dams.

A suitable material for solder dam 20 is a layer of polymer such as epoxy or polyimide with high temperature stability. Solder dams 20 provide the function of retaining liquid eutectic material 16. It will be recalled that burn-in typically occurs at an elevated temperature, around 125 deg. C. Eutectic material 16 has a melting temperature in the range of 10 to 30 deg. C. in the preferred embodiment. Therefore, burn-in testing conducted in an oven at the elevated temperature eventually causes material 16 to melt. Solder dams form a containing barrier to prevent flow of molten metal.

Figure 7:
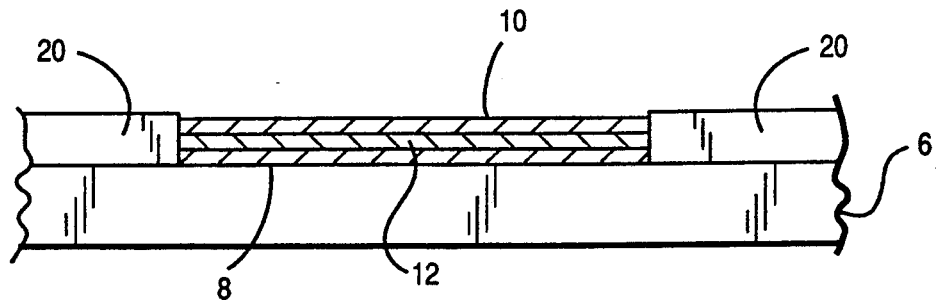
FIG. 7-8 schematically illustrates an embodiment of the present invention wherein the liquid eutectic is formed on the test substrate.
Figure 8:
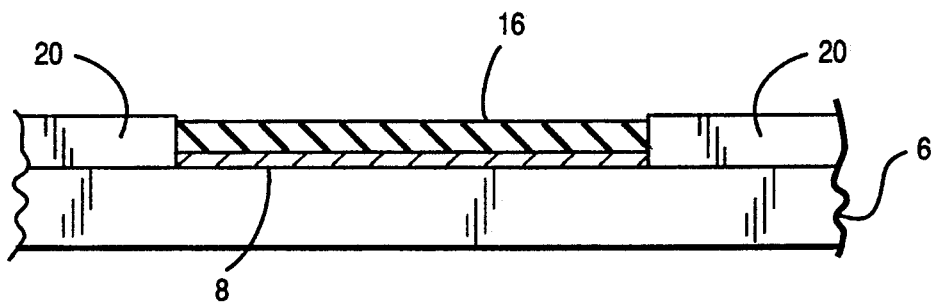
Figure 9:
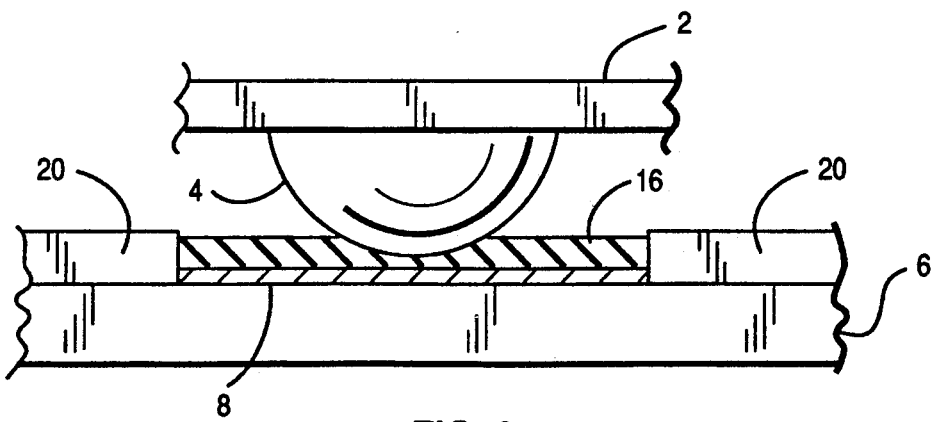
FIG. 9 schematically illustrates the chip placed on the pads containing molten metal.

FIGS. 7-9 illustrate an alternative embodiment of the present invention. In FIG. 7 eutectic material 16 is to be formed as a result of depositing metals 10 and 12 as described in connection with FIG. 3, sequentially on electrical contact pad 8 on substrate 6.

In FIG. 8, the application of heat has caused liquid eutectic material 16 to form from metals 10 and 12.

FIG. 9 shows a C4 bump on chip 2 in testing contact with eutectic material 16.

Our process for carrying out burn-in of a given chip having a pattern of solder bumps thereon, is preferably practiced as described in the following sequence of steps.

A card is fabricated so as to have pads which match the chip solder bump footprint, such that when the chip is placed on the card, electrical connection can be accomplished. This is a requirement since the chip must be electrically active during the burn-in process.

A first metal, for example indium, is deposited on the card pads. This is done by means of a physical evaporation process whereby (a) is heated under vacuum above its vaporization point of which depends upon the pressure used. For example if atmospheric pressure (1 atm) is used, the vaporization point of indium is 2000 deg. C. This deposition is continued until the required thickness is achieved; it has been found by experimentation that 2 mils of metal will accommodate typical tolerance in the assembly.

A second metal, for example gallium, is deposited on the chip bumps through an appropriate mask typically of polyimide with holes to match the chip footprint. This deposition process can be accomplished by heating (b) above its vaporization point which is 2237 deg. C. at 1 atm pressure gallium. This process is continued until the required thickness is achieved, typically approximately 1 mil. This is a thickness that will ensure essentially complete consumption of all the gallium to form the eutectic interface.

The chip is placed on the pads bringing the two metals into contact, and the temperature is raised to the appropriate burn-in temperature by convection heating, typically 125 deg. C. for memory applications. The interface between the two metals will now by a conductive liquid eutectic. The eutectic composition is approximately 75.5% gallium and 24.5% indium by weight with a melting point of 15.7 deg. C.

After the burn-in process is complete, the chip is easily removed, and excess material is cleaned from the pads while the eutectic is in liquid form. The chips that pass the test are now ready to be mounted in their final package and the inoperative chips are discarded.

Removal of the chips while the eutectic is in liquid form prevents damage to the bumps since the process is carried out without physical stress to the joints.

There is a possibility of using a ternary (three metal) eutectic metal systems for this process; however this complicates the process somewhat. An example of such a ternary system is 62.5% Ga, 21.5%. In and 16% Sn with a melting point of 10.7 deg. C. Further, a single metal system using only gallium is also feasible but has the disadvantages of a melting point 4 deg. C. above room temperature. Under such conditions it would not be possible to pre-test the chips on the test substrate at room temperature, prior to burn-in, since good electrical contact is not made.

Those skilled in the art will appreciate that our preferred embodiment has inherent practical advantages. Test substrate 6, as shown in FIG. 6-9, provided with a solder dam and having eutectic material 16 formed entirely thereon may be used and reused as each chip or set of chips 2 undergoes burn-in test for any set of chips 2 may be conducted in a conventional manner. However, upon completion of testing, chips 2 may be removed from their electrical testing contact with eutectic material 16 very easily. Test substrate 6 may be reloaded with additional chips 2 for burn-in while the previously tested chips may be, if tested good, easily cleaned as here and above described, and used.

Chip burn-in in accordance with the present invention includes applying metals to the surfaces of the chip bumps and substrate pads, bringing the chips and substrate into contact so that a eutectic forms at the interface of the metals. The electrical characteristics of the eutectic allow testing to be completed. The liquid state allows easy separation and subsequent cleaning. The temporary nature of this joint facilitates reuse of the test substrate.

While the present invention has been described having reference to a particular preferred embodiment, those having skill in the art will appreciate that the above noted and other modifications to form and detail may be made without departing from the spirit and scope of the invention.

We claim:

1. A method of temporarily bonding electronic chips to metallized pads on a circuitized substrate comprising the steps of:
   choosing a first metal indium and a second metal gallium as a pair of metals for spontaneously forming a eutectic molten mixture at a temperature in the range of from about 10 deg. C. to about 30 deg. C.;
   providing a solder dam at each substrate pad;
   depositing a first of said pair of metals on substrate pads;
   depositing a second of said pair of metals over chip terminal bumps; and
   bringing chip terminal bumps and metallized pads into contact.

2. A non-destructive method for performing electrical burn-in testing of semiconductor chips adapted for subsequent direct attachment to circuitized substrates comprising:
   providing a circuitized substrate with a pattern of pads complementary to terminals on chips to be tested;
   surrounding each pad with a solder dam;
   applying a first of a pair of metals, which spontaneously upon contact with each other form a eutectic, to terminals on the chips;
   applying a second of said pair of metals on said pads;
   placing chips on pads so as to bring said first and second of the pair of metals into contact;
   heating said test substrate for causing said metals to enter their liquid eutectic state;
   performing a burn-in test;
   removing chips from pads; and
   cleaning any remaining eutectic material.

3. The method of claim 2 wherein:
   said first applying step comprises coating terminals on the chips with gallium; and
   said second applying step comprises coating said pads with indium.

4. The method of claim 2 wherein:
   said first applying step comprises coating terminals on the chips with indium; and
   said second applying step comprises coating said pads with gallium.

5. A method of nondestructively attaching to and removing from a substrate electronic chips comprising the sequential steps of:
   1. choosing a pair of metals consisting of gallium and indium, for forming a eutectic spontaneously at room temperature;
   2. coating chips with a first metal chosen from the pair of metals;
   3. forming a eutectic spontaneously at room temperature;
   4. coating substrate pads with the other of the pair of metals in step 1;
   5. applying pressure while said first and second metals are in contact for forming a eutectic bonding material; and
   6. releasing pressure applied in step 5 for enabling separation of the chips from the substrate.

6. A method of non destructively, temporarily joining an electronic device having bumped contacts to a circuitized substrate comprising:
   providing solder dams around lands in the circuitry on the substrate adapted for mating with bumped contacts of said electronic device;
   coating dammed lands with indium to a depth of from about 1 mil to about 3 mils;
   overcoating indium coated lands with gallium to a depth of about 1 mil;
   exposing the metals to heat for forming liquid eutectic therefrom; and
   placing said electronic device on the pads whereby said bumped contacts are electrically joining with said pads by the liquid eutectic.

* * * * *

UNITED STATES PATENT AND TRADEMARK OFFICE
CERTIFICATE OF CORRECTION

PATENT NO. : 5,007,163

DATED : April 16, 1991

INVENTOR(S) : Keith R. Pope and Gustav Schrottke

It is certified that error appears in the above-identified patent and that said Letters Patent is hereby corrected as shown below:

On the title page and col. 1, line 1, delete "NON-DESTRUCTURE" and insert --NON-DESTRUCTIVE--.

Signed and Sealed this

Twenty-second Day of December, 1992

Attest:

DOUGLAS B. COMER

Attesting Officer

Acting Commissioner of Patents and Trademarks